United States Patent
Misek et al.

(10) Patent No.: US 9,972,385 B2
(45) Date of Patent: May 15, 2018

(54) MEMORY ARRAY DRIVER

(71) Applicant: HEWLETT PACKARD ENTERPRISE DEVELOPMENT LP, Houston, TX (US)

(72) Inventors: Phillip David Misek, Fort Collins, CO (US); Brent Buchanan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 15/328,269

(22) PCT Filed: Nov. 4, 2014

(86) PCT No.: PCT/US2014/063842
§ 371 (c)(1),
(2) Date: Jan. 23, 2017

(87) PCT Pub. No.: WO2016/072974
PCT Pub. Date: May 12, 2016

(65) Prior Publication Data
US 2017/0229171 A1    Aug. 10, 2017

(51) Int. Cl.
*G11C 13/00* (2006.01)
(52) U.S. Cl.
CPC ........ *G11C 13/0023* (2013.01); *G11C 13/004* (2013.01); *G11C 13/0038* (2013.01); *G11C 13/0069* (2013.01); *G11C 2213/79* (2013.01)
(58) Field of Classification Search
CPC .................................................. G11C 13/0038
See application file for complete search history.

(56) References Cited

U.S. PATENT DOCUMENTS 6,115,317 A    9/2000  Kim
7,940,554 B2 *    5/2011  Scheuerlein ........... G11O 5/025
                                                          365/163

(Continued)

FOREIGN PATENT DOCUMENTS

JP      2004118998      4/2004
KR      20020096539     12/2002

(Continued)

OTHER PUBLICATIONS

International Search Report and Written Opinion; PCT/US2014/063842; dated Jul. 21, 2014; 11 pages.

(Continued)

*Primary Examiner* — Anthan Tran
*Assistant Examiner* — Mushfique Siddique
(74) *Attorney, Agent, or Firm* — Hewlett Packard Enterprise Patent Department (57) ABSTRACT

Example implementations relate to memory array drivers. For example, a memory array includes a memory cell. The memory array also includes a bit line coupled to the memory cell and a word line coupled to the memory cell. The memory array further includes a first memory array driver having a first terminal and a second terminal. The first terminal is coupled to the bit line. The second terminal is coupled to the word line. The memory array further includes a second memory array driver having a third terminal and a fourth terminal. The third terminal is coupled to the bit line. The fourth terminal is coupled to the word line.

13 Claims, 5 Drawing Sheets

(56) References Cited

U.S. PATENT DOCUMENTS

| | | |
|---|---|---|
| 8,058,636 B2 | 11/2011 | Osano et al. |
| 8,194,433 B2 | 6/2012 | Parkinson |
| 8,542,543 B2* | 9/2013 | Hwang ................ G11O 5/063 |
| | | 365/148 |
| 8,619,458 B2 | 12/2013 | Back et al. |
| 9,099,176 B1* | 8/2015 | Buskirk ............. G11C 13/0002 |
| 2007/0164388 A1* | 7/2007 | Kumar ............... G11C 11/5692 |
| | | 257/458 |
| 2007/0183191 A1* | 8/2007 | Kim ......................... G11C 7/02 |
| | | 365/175 |
| 2008/0273365 A1* | 11/2008 | Kang ..................... G11C 11/14 |
| | | 365/51 |
| 2009/0129195 A1* | 5/2009 | De Brosse ............... G11C 7/12 |
| | | 365/230.06 |
| 2009/0207645 A1* | 8/2009 | Parkinson ................ G11C 8/16 |
| | | 365/145 |
| 2011/0128767 A1 | 6/2011 | Dray |
| 2011/0280059 A1 | 11/2011 | Xiao et al. |
| 2011/0283039 A1 | 11/2011 | Terao et al. |
| 2012/0039112 A1 | 2/2012 | Jung et al. |
| 2012/0147659 A1 | 6/2012 | Carter et al. |
| 2012/0314477 A1 | 12/2012 | Siau et al. |
| 2013/0088909 A1* | 4/2013 | Liu .................... G11C 13/0038 |
| | | 365/148 |
| 2014/0050038 A1 | 2/2014 | Chen et al. |
| 2014/0149773 A1* | 5/2014 | Huang ............... G11C 13/0007 |
| | | 713/323 |
| 2014/0325120 A1* | 10/2014 | Park ..................... G11C 13/003 |
| | | 711/103 |
| 2015/0055407 A1* | 2/2015 | Mantegazza ....... G11C 13/0069 |
| | | 365/163 |
| 2016/0379710 A1* | 12/2016 | Sekar .................. G11C 13/004 |
| | | 365/148 |
| 2017/0140819 A1* | 5/2017 | Lee .................... G11C 13/0026 |

FOREIGN PATENT DOCUMENTS

| | | |
|---|---|---|
| TW | 200707438 | 2/2007 |
| TW | 201234375 | 8/2012 |

OTHER PUBLICATIONS

Linn, E. et al., Complementary Resistive Switches for Passive Nanocrossbar Memories, (Web Page), Apr. 18, 2010, 4 Pages.

* cited by examiner

MEMORY ARRAY DRIVER

BACKGROUND

Non-volatile memory may be a storage device that retains data even when power is not provided to the storage device. There are different types of non-volatile memory, such as flash memory, ferroelectric memory, and resistive memory.

BRIEF DESCRIPTION OF THE DRAWINGS

Some examples of the present application are described with respect to the following figures.

DETAILED DESCRIPTION

As described above, a type of non-volatile memory may be resistive memory. A resistive memory cell may store different logic values based on the electrical resistance in the resistive memory cell. For example, to store a logical 0, the electrical resistance of a resistive memory cell may be set to a high resistive state. To store a logic 1, the electrical resistance of a resistive memory cell may be set to a low resistive state. One type of resistive memory cell is a bidirectional resistive memory cell. The electrical resistance of a bidirectional resistive memory cell may be set by varying a polarity of an applied voltage. For example, a first voltage having a first polarity (i.e., a first direction) may be applied to a bidirectional resistive memory cell to set the electrical resistance to a high resistive state. A second voltage having a second polarity (i.e., a second direction) may be applied to the bidirectional resistive memory cell to set the electrical resistance to a low resistive state.

When a memory array is implemented using at least one bidirectional resistive memory cell, multiple drive circuits external to the memory array may be used to provide voltage sources having different polarities. For example, two drive circuits may be used to provide voltage sources having different polarities to bit lines of the memory array. Thus, the device area associated with the memory array may be increased.

Examples described herein provide a memory array driver to reduce the amount of supporting circuitry, such as a drive circuit, external to a memory array. For example, a memory array may include a memory cell, such as a bidirectional resistive memory cell. The memory array may also include a bit line coupled to the memory cell and a word line coupled to the memory cell. The memory array further includes a first memory array driver having a first terminal and a second terminal. The first terminal may be coupled to the bit line and the second terminal may be coupled to the word line. The memory array may further include a second memory array driver having a third terminal and a fourth terminal. The third terminal may be coupled to the bit line and the fourth terminal may be coupled to the word line. The first memory array driver and the second memory array driver may set a direction of an operation associated with the memory cell in parallel. In this manner, examples described herein may reduce the device area associated with the memory array.

Figure 1:
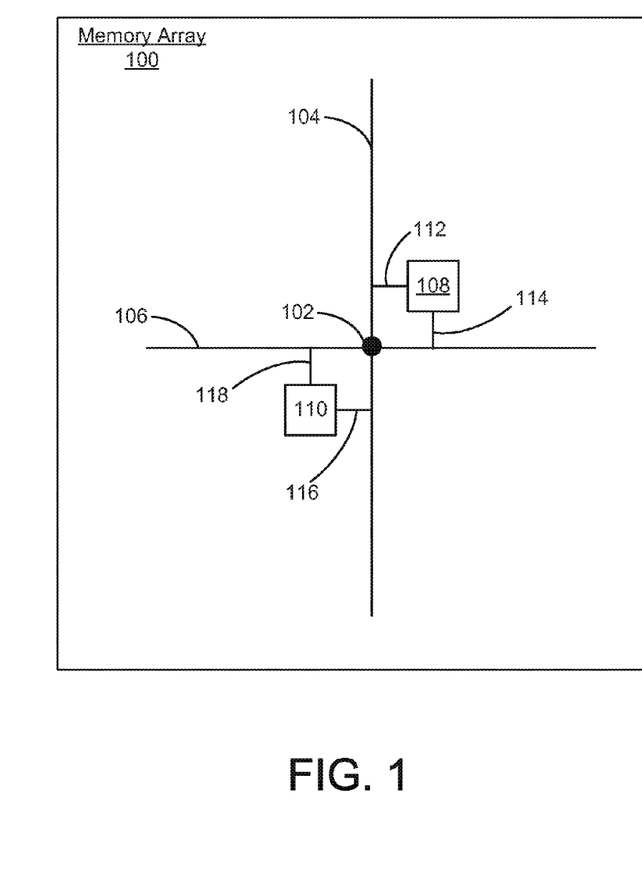
FIG. 1 is a block diagram of a memory array including a memory array driver, according to an example.

Referring now to the figures, FIG. 1 is a block diagram of a memory array 100 including a memory array driver, according to an example. Memory array 100 may be a storage device or circuit that includes at least one memory cell. Memory array 100 may include a memory cell 102. Memory cell 102 may be a storage device or circuit. In some examples, memory cell 102 may be a bidirectional resistive memory cell implemented using at least one memristor. Memory array 100 may also include a bit line 104 and a word line 106. Bit line 104 and word line 106 may be coupled to memory cell 102. Bit line 104 and word line 106 may be implemented as conductive metal traces. Bit line 104 may correspond to a column of memory array 100 and word line 106 may correspond to a row of memory array 100.

Memory array 100 may further include a first memory array driver 108 and a second memory array driver 110. Memory array drivers 108 and 100 may be circuitry that directs current to pass through memory cell 102. First memory array driver 108 may include a first terminal 112 that is coupled to bit line 104. First memory array driver 108 may also include a second terminal 114 that is coupled to word line 106. Second memory array driver 110 may include a third terminal 116 that is coupled to bit line 104. Second memory array driver 110 may also include a fourth terminal 118 that is coupled to word line 106.

During operation, memory array drivers 108 and 110 may, in parallel, set a direction of an operation associated with memory cell 102, such as a write operation associated with memory cell 102. That is, memory array drivers 108 and 110 may set the polarity of a voltage applied to memory cell 102 by directing the manner in which current passes through memory cell 102. Thus, by utilizing memory array drivers 108 and 110 that are internal to memory array 100 to set the direction of an operation, the number of drive circuits external to memory array 100 may be reduced and the device area associated with memory array 100 may be reduced. Operations of an example memory array are described in more detail in FIG. 2.

In some examples, memory array 100 may be a cross point memory array. In a cross point memory array, bit lines and word lines may be implemented in distinct layers so that the bit lines and the word lines form a matrix. For example, bit line 104 may be implemented in a first metal layer that is orientated in a first direction on a substrate. Word line 106 may be implemented in a second metal layer that is orientated in a second direction such that the second metal layer may form a cross with the first metal layer. Memory cell 102 may be implemented using at least one dielectric layer that is sandwiched between the first metal layer and the second metal layer. The at least one dielectric layer may be coupled to the metal layers using vias.

Figure 2:
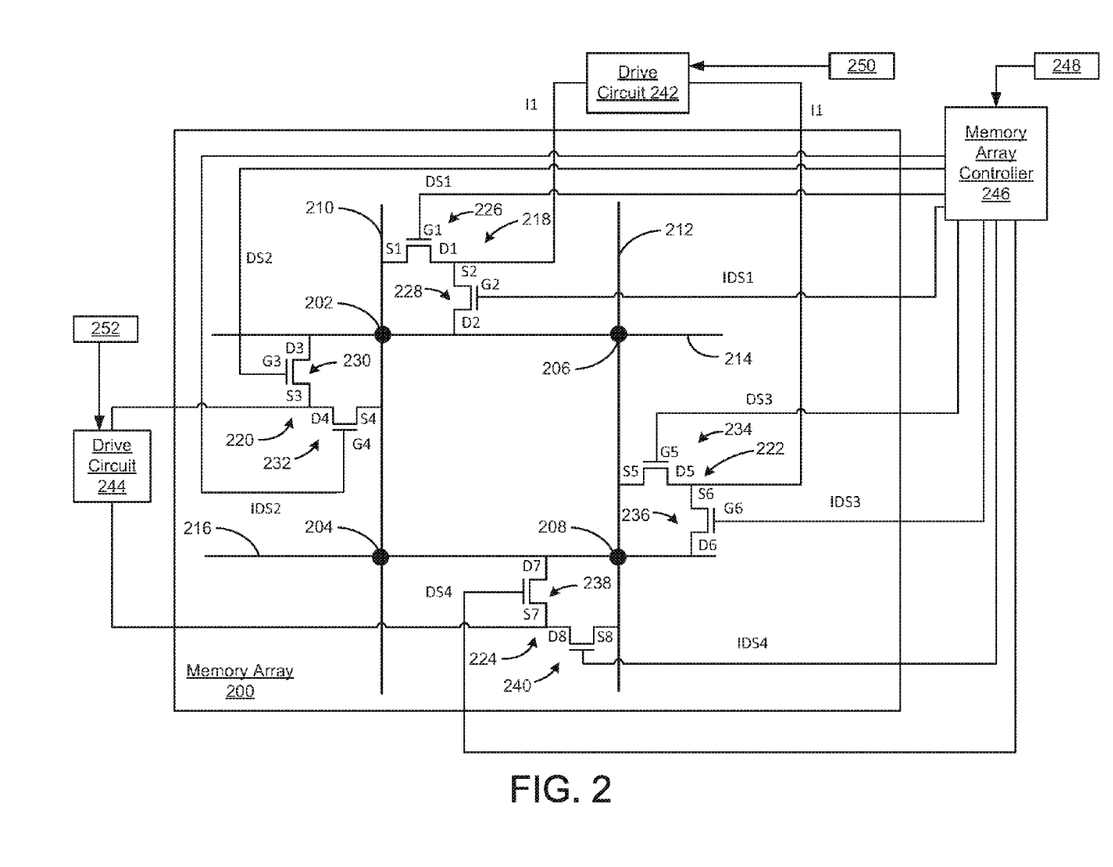
FIG. 2 is a block diagram of a memory array including a memory array driver, according to an example.

FIG. 2 is a block diagram of a memory array 200 including a memory array driver, according to an example. Memory array 200 may be similar to memory array 100 of FIG. 1. Memory array 200 may include a plurality of memory cells, such as memory cells 202, 204, 206, and 208. Memory cells 202-208 may be similar to memory cell 102. As described in more detail below, a distinct current path of each of the plurality of memory cells may be determined via at least one memory array driver.

Memory array 200 may also include a plurality of bit lines and word lines. For example, memory array 200 may include a bit line 210 and a bit line 212. Bit lines 210 and 212 may be similar to bit line 104. Memory array 200 may also include a word line 214 and a word line 216. Word lines 214 and 216 may be similar to word line 106. Memory cell 202 may be coupled to bit line 210 and to word line 214. Memory cell 204 may be coupled to bit line 210 and to word line 216. Memory cell 206 may be coupled to bit line 212 and to word line 214. Memory cell 208 may be coupled to be coupled to bit line 212 and to word line 216.

Memory array 200 may further include a plurality of memory array drivers. For example, memory array 200 may include a first memory array driver 218, a second memory array driver 220, a third memory array driver 222, and a fourth memory array driver 224. Memory array drivers 218 and 220 may be coupled to bit line 210 and to word line 214. Memory array drivers 222 and 224 may be coupled to bit line 212 and to word line 216. Thus, each bit line of memory array 200 may be coupled to a distinct pair of memory array drivers and each word line of memory array 200 may also be coupled to a distinct pair of memory array drivers. Memory array drivers 218-224 may be similar to memory array drivers 108-110.

Each of memory array drivers 218-224 may include a pair of transistors coupled in series. For example, first memory array driver 218 may include a first transistor 226 and a second transistor 228. A first source terminal S1 of first transistor 226 may be coupled to bit line 210. A first drain terminal D1 of first transistor 226 may be coupled to a second source terminal S2 of second transistor 228. A second drain terminal D2 of second transistor 228 may be coupled to word line 214.

Second memory array driver 220 may include a third transistor 230 and a fourth transistor 232 coupled in series. A third drain terminal D3 of third transistor 230 may be coupled to word line 214. A third source terminal S3 of third transistor 230 may be coupled to a fourth drain terminal D4 of fourth transistor 232. A fourth source terminal S4 of fourth transistor 232 may be coupled to bit line 210.

Third memory array driver 222 may include a fifth transistor 234 and a sixth transistor 236 coupled in series. A fifth source terminal S5 of fifth transistor 234 may be coupled to bit line 212. A fifth drain terminal D5 may be coupled to a sixth source terminal S6 of sixth transistor 236. A sixth drain terminal D6 of sixth transistor 236 may be coupled to word line 216.

Fourth memory array driver 224 may include a seventh transistor 238 and an eighth transistor 240. A seventh drain terminal D7 of seventh transistor 238 may be coupled to word line 216. A seventh source terminal S7 of seventh transistor 238 may be coupled to an eighth drain terminal D8 of eighth transistor 240. An eighth source terminal S8 of eighth transistor 240 may be coupled to bit line 212.

A first drive circuit 242 may be coupled to first memory array driver 218 via first drain terminal D1 and via second source terminal S2. First drive circuit 242 may also be coupled to third memory array driver 222 via fifth drain terminal D5 and via sixth source terminal S6. First drive circuit 242 may provide a first voltage source having a first polarity (e.g., a positive polarity) to memory array drivers 218 and 222. Thus, first drive circuit 242 may also be a first current source. First drive circuit 242 may include additional circuitry (not shown in FIG. 2), such as a sensing circuit, a current mirror, etc.

A second drive circuit 244 may be coupled to second memory array driver 220 via third source terminal S3 and via fourth drain terminal D4. Second drive circuit 244 may be coupled to fourth memory array driver 224 via seventh source terminal S7 and via eighth drain terminal D8. Second drive circuit 244 may provide a second voltage source having a second polarity (e.g., a negative polarity) opposite to the first polarity to memory array drivers 220 and 224. Thus, second drive circuit 244 may also be a second current source. Second drive circuit 244 may include additional circuitry (not shown in FIG. 2), such as a sensing circuit, a current mirror, etc.

A memory array controller 246 may be coupled to transistors 226-240 via a respective gate terminal, such as a first gate terminal G1 of first transistor 226, a second gate terminal G2 of second transistor 228, a third gate terminal G3 of third transistor 230, a fourth gate terminal G4 of fourth transistor 232, a fifth gate terminal G5 of fifth transistor 234, a sixth gate terminal G6 of sixth transistor 236, a seventh gate terminal G7 of seventh transistor 238, and an eighth gate terminal G8 of eighth transistor 240.

During operation, memory array controller 246 may receive an address selection signal 248, for example, from a host device that may initiate an operation associated with a memory cell in memory array 200. Address selection signal 248 may include an address of a memory cell and a direction bit of the operation. The direction bit may indicate a direction of the operation.

In some examples, drive circuits 242 and 244 may also receive operation signals 250 and 252, respectively, from the host device. Operation signals 250 and 252 may indicate the type of operation that is to be performed, such as a write operation and a read operation. Based on operation signals 250 and 252, drive circuits 242 and 244 may set the magnitudes of the voltage and/or current to be applied to memory array 200, respectively.

As an example, address selection signal 248 may include the address of memory cell 202 and the direction bit may indicate a first direction (e.g., a forward direction). Operation signals 250 and 252 may indicate a write operation. Thus, a write operation in the first direction is to be performed on memory cell 202.

Based on address selection signal 248, memory array controller 246 may assert direction signals to memory array drivers 218 and 220 to set the direction of the write operation. Based on the respective direction signals, memory array drivers 218 and 220 may set current paths (e.g., a first current path and a second current path) that are associated with the write operation in parallel. For example, memory array controller 246 may assert a first direction signal DS1 to a first gate terminal G1 of first transistor 226 and an inverted first direction signal IDS1 to a second gate terminal G2 of second transistor 228. First direction signal DS1 may set the operation state of first transistor 226 to a first operation state (e.g., turning first transistor 226 on). Inverted first direction signal IDS1 may set the operation state of second transistor 228 to a second operation state that is opposite to the first operation state (e.g., turning second transistor 228 off and/or not turning on second transistor 228). Thus, first transistor 226 may set the first current path associated with the write operation.

Memory array controller 246 may also assert a second direction signal DS2 to a third gate terminal G3 of third transistor 230 and an inverted second direction signal IDS2 to a fourth gate terminal G4 of fourth transistor 232. Second direction signal DS2 may set the operation state of third transistor 230 to the first operation state. Inverted second direction signal IDS2 may set the operation state of fourth transistor 232 to the second operation state. Thus, third transistor 230 may set the second current path associated with the write operation. In some examples, memory array controller 246 may assert any combination of direction signals DS1, IDS1, DS2, and IDS2 in parallel.

Based on the first current path and the second current path, a current I1 generated using first drive circuit 242 may flow from first drive circuit 242 to first transistor 226. Current I1 may then flow from first transistor 226 to memory cell 202 via bit line 210. Current I1 may then flow from memory cell 202 to third transistor 230 via word line 214. Current I1 may further flow from third transistor 230 to second drive circuit 244 to complete the write operation.

As another example, a second write operation is to be performed on memory cell 202 in a second direction that is opposite to the first direction. To perform the second write operation, second transistor 228 and fourth transistor 232 may be turned on using direction signals IDS1 and IDS2, respectively. First transistor 226 and third transistor 230 may be turned off using direction signals DS1 and DS2, respectively. Thus, current I1 may flow from first drive circuit 242 to second transistor 228. Current I1 may then flow from second transistor 228 to memory cell 202 via word line 214. Current I1 may then flow from memory cell 202 to fourth transistor 232 via bit line 210. Current I1 may further flow from fourth transistor 232 to second drive circuit 244 to complete the second write operation.

Thus, by controlling the operation states of transistors 226-232 via memory array controller 246, connections from drive circuits 242 and 244 to bit lines and word lines of memory array 200 may be swapped to set a direction of an operation associated with a memory cell. The direction may be changed for each distinct operation. Hence, the amount of external circuitry, such as additional drive circuits, may be reduced.

In some examples, a read operation may be performed on memory cell 202 in the same direction as a write operation associated with memory cell 202. In some examples, a read operation may be performed on memory cell 202 in the opposite direction as a write operation associated with memory cell 202.

As another example, an operation to be performed on memory cell 204 in the first direction is described. Based on address selection signal 248, memory array controller 246 may assert a third direction signal DS3 to a fifth gate terminal G5 of fifth transistor 234 and an inverted third direction signal IDS3 to a sixth gate terminal G6 of sixth transistor 236. Further, memory array controller 246 may assert second direction signal DS2 to third transistor 230 and inverted second direction signal IDS2 to fourth transistor 232. Based on direction signals DS2, IDS2, DS3, and IDS3, transistors 232 and 236 may be turned on and transistors 230 and 234 may be turned off.

Thus, current I1 may flow from first drive circuit 242 to sixth transistor 236. Current I1 may then flow from sixth transistor 236 to memory cell 204 via bit line 216. Current I1 may then flow from memory cell 204 to fourth transistor 232 via bit line 210. Current I1 may further flow from fourth transistor 232 to second drive circuit 244 to complete the operation.

When the operation is to be performed on memory cell in the second direction, first transistor 226 may be turned on via first direction signal DS1 and seventh transistor 238 may be turned on via a fourth direction signal DS4 received at a seventh gate terminal G7 of seventh transistor 238. Second transistor 228 may be turned off via inverted first direction signal IDS1 and eighth transistor 240 may be turned off via an inverted fourth direction signal IDS4 received at an eighth gate terminal G8 of eighth transistor 240.

Thus, current I1 may flow from first drive circuit 242 to first transistor 226. Current I1 may then flow from first transistor 226 to memory cell 204 via bit line 210. Current I1 may then flow from memory cell 204 to seventh transistor 238 via word line 216. Current I1 may further flow from seventh transistor 238 to second drive circuit 244 to complete the operation.

Although four memory cells are shown in FIG. 2, it should be understood that memory array 200 may include any number of memory cells.

Figure 3:
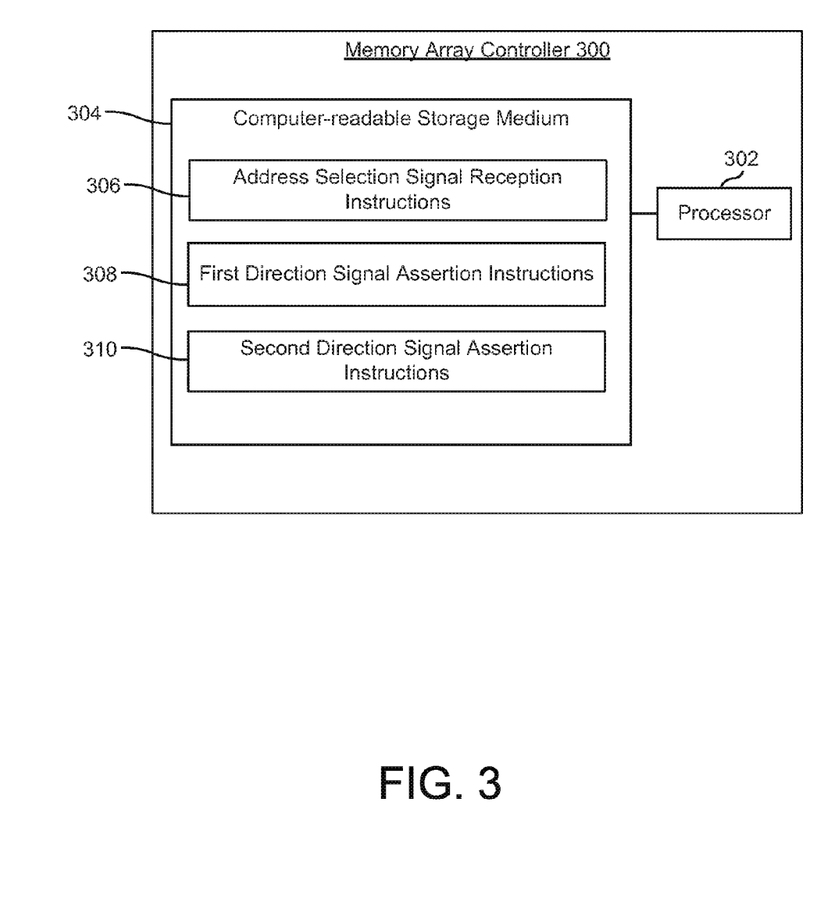
FIG. 3 is a block diagram of a memory array controller to direct operation of a memory array including a memory array driver, according to an example.

FIG. 3 is a block diagram of a memory array controller 300 to direct operation of a memory array including a memory array driver, according to an example. Memory array controller 300 may implement memory array controller 246 of FIG. 2. Memory array controller 300 may include a processor 302 and a computer-readable storage medium 304.

Processor 302 may be a central processing unit (CPU), a semiconductor-based microprocessor, and/or other hardware devices suitable for retrieval and execution of instructions stored in computer-readable storage medium 304. Processor 302 may fetch, decode, and execute instructions 306, 308, and 310 to control a process of setting a direction of an operation associated with a memory cell of a memory array. As an alternative or in addition to retrieving and executing instructions, processor 302 may include at least one electronic circuit that includes electronic components for performing the functionality of instructions 306, 308, 310, or a combination thereof.

Computer-readable storage medium 304 may be any electronic, magnetic, optical, or other physical storage device that contains or stores executable instructions. Thus, computer-readable storage medium 304 may be, for example, Random Access Memory (RAM), an Electrically Erasable Programmable Read-Only Memory (EEPROM), a storage device, an optical disc, etc. In some examples, computer-readable storage medium 304 may be a non-transitory storage medium, where the term "non-transitory" does not encompass transitory propagating signals. As described in detail below, computer-readable storage medium 304 may be encoded with a series of processor executable instructions 306-310 for setting a direction of an operation associated with a memory cell of a memory array.

Address selection signal reception instructions 306 may receive address selection signal, such as address selection signal 248, from a host device. First direction signal assertion instructions 308 may assert a first direction signal, such as first direction signal DS1, to a memory array driver. Second direction signal assertion instructions 310 may assert a second direction signal, such as second direction signal DS2, to another memory array driver.

Figure 4:
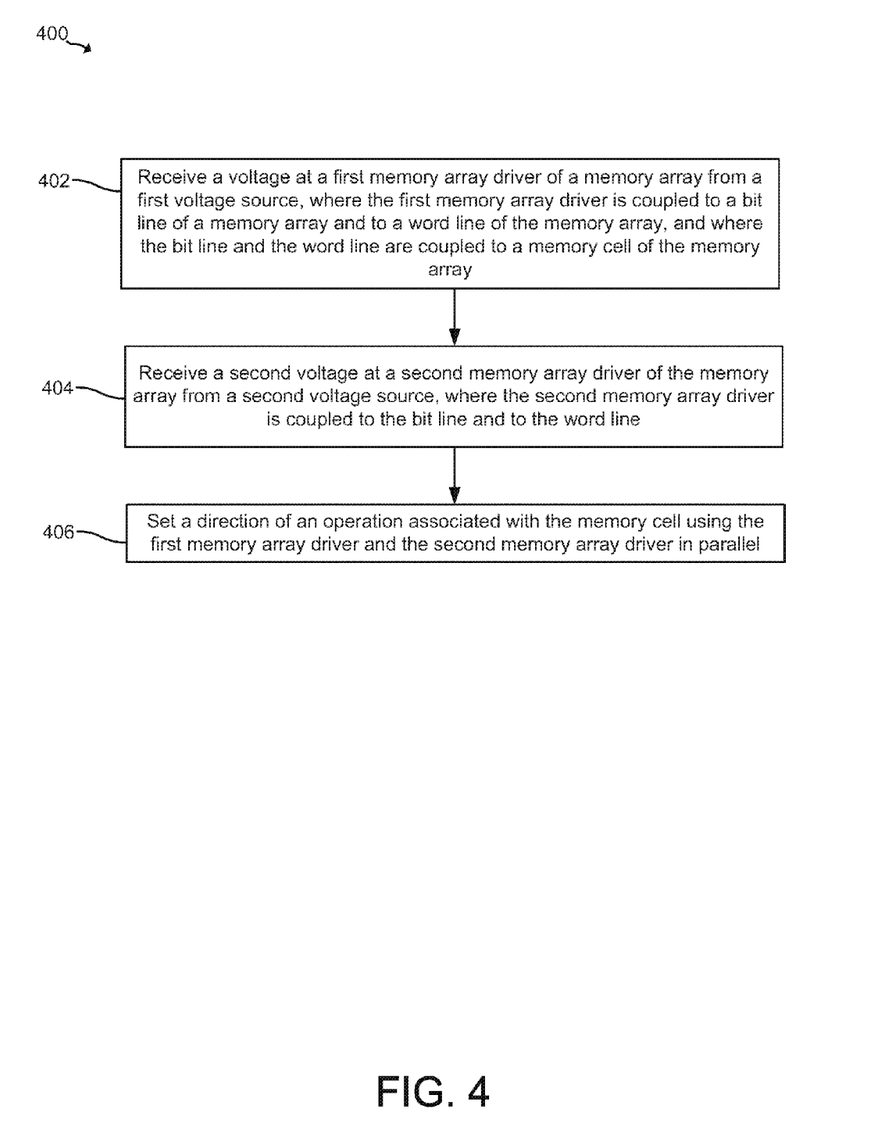
FIG. 4 is a flowchart illustrating a method of operating a memory array including a memory array driver, according to an example.

FIG. 4 is a flowchart illustrating a method 400 of operating a memory array including a memory array driver, according to an example. Method 400 may be implemented using memory array 100 of FIG. 1 and/or memory array 200 of FIG. 2. Method 400 includes receiving a voltage at a first memory array driver of a memory array from a first voltage source, where the first memory array driver is coupled to a bit line of a memory array and to a word line of the memory array, and where the bit line and the word line are coupled to a memory cell of the memory array, at 402. For example, referring to FIG. 2, first drive circuit 242 may be coupled to first memory array driver 218 via first drain terminal D1 and via second source terminal S2. First memory array driver 218 may include first transistor 226 and second transistor 228. First source terminal S1 of first transistor 226 may be coupled to bit line 210. First drain terminal D1 of first transistor 226 may be coupled to a second source terminal S2 of second transistor 228. Second drain terminal D2 of second transistor 228 may be coupled to word line 214. Memory cell 202 may be coupled to bit line 210 and to word line 214.

Method 400 also includes receiving a second voltage at a second memory array driver of the memory array from a second voltage source, where the second memory array driver is coupled to the bit line and to the word line, at 404. For example, referring to FIG. 2, second memory array driver 220 may be coupled to bit line 210 and to word line 214. Second drive circuit 244 may be coupled to second memory array driver 220 via third source terminal S3 and via fourth drain terminal D4.

Method 400 further includes setting a direction of an operation associated with the memory cell using the first memory array driver and the second memory array driver in parallel, at 406. For example, referring to FIG. 2, based on the respective direction signals, memory array drivers 218 and 220 may set current paths (e.g., a first current path and a second current path) that are associated with the write operation in parallel.

Figure 5:
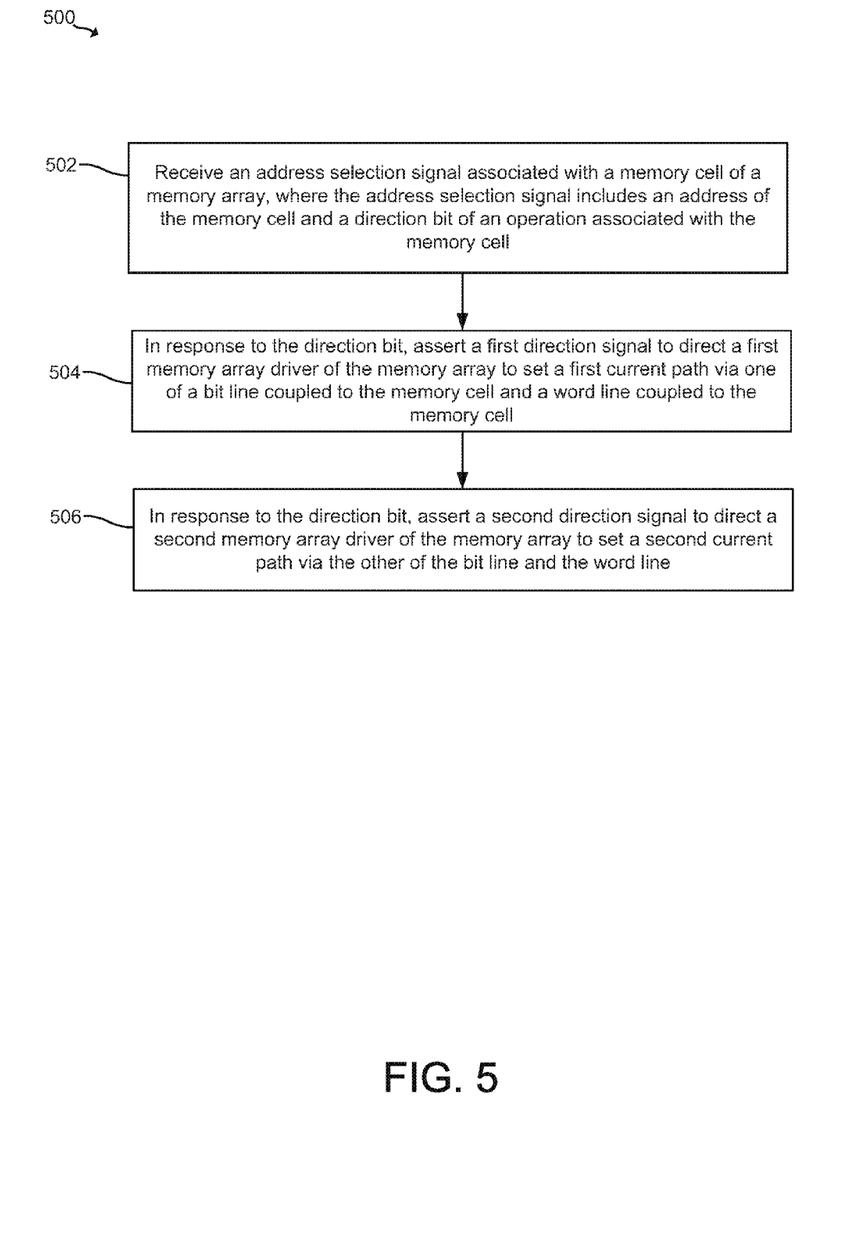
FIG. 5 is a flowchart illustrating a method of operating a memory array controller to direct operation of a memory array including a memory array driver, according to an example.

FIG. 5 is a flowchart illustrating a method 500 of operating a memory array controller to direct operation of a memory array including a memory array driver, according to an example. Method 500 may be implemented using memory array controller 246 of FIG. 2 and/or memory array controller 300 of FIG. 3.

Method 500 includes receiving an address selection signal associated with a memory cell of a memory array, where the address selection signal includes an address of the memory cell and a direction bit of an operation associated with the memory cell, at 502. For example, referring to FIG. 2, memory array controller 246 may receive address selection signal 248, for example, from a host device that may initiate an operation associated with a memory cell in memory array 200. Address selection signal 248 may include an address of a memory cell and a direction bit of the operation. The direction bit may indicate a direction of the operation.

Method 500 also includes, in response to the direction bit, assert a first direction signal to direct a first memory array driver of the memory array to set a first current path via one of a bit line coupled to the memory cell and a word line coupled to the memory cell, at 504. For example, referring to FIG. 2, memory array controller 246 may assert first direction signal DS1 to first gate terminal G1 of first transistor 226 and inverted first direction signal IDS1 to second gate terminal G2 of second transistor 228.

Method 500 further includes, in response to the direction bit, assert a second direction signal to direct a second memory array driver of the memory array to set a second current path via the other of the bit line and the word line, at 506. For example, referring to FIG. 2, memory array controller 246 may also assert second direction signal DS2 to a third gate terminal G3 of third transistor 230 and inverted second direction signal IDS2 to a fourth gate terminal G4 of fourth transistor 232.

The use of "comprising", "including" or "having" are synonymous and variations thereof herein are meant to be inclusive or open-ended and do not exclude additional unrecited elements or method steps.

What is claimed is:

1. A memory array comprising:
    a memory cell;
    a bit line coupled to the memory cell;
    a word line coupled to the memory cell;
    a first memory array driver having a first terminal and a second terminal, wherein the first terminal is coupled to the bit line, and wherein the second terminal is coupled to the word line, and wherein a first direction signal asserted by a memory array controller directs the first memory array driver to set a first current path via one of the bit line coupled to the memory cell and the word line coupled to the memory cell; and
    a second memory array driver having a third terminal and a fourth terminal, wherein the third terminal is coupled to the bit line, and wherein the fourth terminal is coupled to the word line, and wherein a second direction signal asserted by the memory array controller in parallel with the first direction signal directs the second memory array driver to set a second current path via the other of the bit line and the word line.

2. The memory array of claim 1, wherein the memory cell is a bidirectional resistive memory cell, wherein the first memory array driver is coupled to a first voltage source having a first polarity, and wherein the second memory array driver is coupled to a second voltage source having a second polarity opposite to the first polarity.

3. The memory array of claim 1, wherein the first memory array driver includes:
    a first transistor having a first drain terminal and a first source terminal; and
    a second transistor coupled to the first transistor, wherein the second transistor includes a second drain terminal and a second source terminal; and
    wherein the second memory array driver includes:
        a third transistor having a third drain terminal and a third source terminal; and
        a fourth transistor coupled to the third transistor, wherein the second transistor includes a fourth drain terminal and a fourth source terminal.

4. The memory array of claim 3, wherein the first transistor and the third transistor have a first operation state, wherein the second transistor and the fourth transistor have a second operation state that is opposite to the first operation state, wherein the first transistor is coupled to the second transistor in series, and wherein the third transistor is coupled to the fourth transistor in series.

5. The memory array of claim 3, wherein the first source terminal and the fourth source terminal are coupled to the bit line, wherein the first drain terminal is coupled to the second source terminal, wherein the second drain terminal and the third drain terminal are coupled to the word line, and wherein the third source terminal is coupled to the fourth drain terminal.

6. The memory array of claim 5, wherein the first drain terminal and the second source terminal are coupled to a first voltage source having a first polarity, wherein the third source terminal and the fourth drain terminal are coupled to a second voltage source having a second polarity that is opposite of the first polarity.

7. The memory array of claim 1, further comprising a plurality of bit lines, wherein each of the plurality of bit lines is coupled to a distinct pair of memory array drivers, and wherein the memory array is a cross point memory array.

8. The memory array of claim 1, further comprising a plurality of memory cells coupled to the bit line, wherein a distinct current path of each of the plurality of memory cells is determined via one of the first memory array driver and the second memory array driver.

9. A method comprising:
receiving a voltage at a first memory array driver of a memory array from a first voltage source, wherein the first memory array driver is coupled to a bit line of a memory array and to a word line of the memory array, and wherein the bit line and the word line are coupled to a memory cell of the memory array;
receiving a second voltage at a second memory array driver of the memory array from a second voltage source, wherein the second memory array driver is coupled to the bit line and to the word line;
setting a direction of an operation associated with the memory cell by using the first memory array driver and the second memory array driver in parallel to set a polarity of a voltage applied to the memory cell;
receiving, at the first memory array driver, a first direction signal from a memory array controller; and
receiving, at the second memory array driver, a second direction signal from the memory array controller, wherein the first direction signal and the second direction signal are indicative of the direction of the operation, and wherein setting the direction of the operation using the first memory array driver and the second memory array driver in parallel includes:
setting a first current path associated with the operation via the first memory array driver based on the first direction signal; and
setting a second current path associated with the operation via the second memory array driver based on the second direction signal, wherein during a write operation of the memory cell, the first current path includes the bit line and the second current path includes the word line, and during a read operation of the memory cell, the first current path includes the word line and the second current path includes the bit line.

10. The method of claim 9, wherein when the first direction signal and the second direction signal are indicative of a first direction of the operation, the first current path includes the bit line and the second current path includes the word line, and wherein when the first direction signal and the second direction signal are indicative of a second direction of the operation, the first current path includes the word line and the second current path includes the bit line.

11. A non-transitory computer-readable storage medium comprising instructions that when executed cause a processor of a memory array controller to:
receive an address selection signal associated with a memory cell of a memory array, wherein the address selection signal includes an address of the memory cell and a direction bit of an operation associated with the memory cell;
in response to the direction bit, assert a first direction signal to direct a first memory array driver of the memory array to set a first current path via one of a bit line coupled to the memory cell and a word line coupled to the memory cell; and
in response to the direction bit, assert a second direction signal to direct a second memory array driver of the memory array to set a second current path via the other of the bit line and the word line, wherein during a write operation associated with the memory cell, the first current path includes the bit line and the second current path includes the word line, and during a read operation associated with the memory cell, the first current path includes the word line and the second current path includes the bit line.

12. The non-transitory computer-readable storage medium of 11, wherein the instructions when executed further cause the processor to assert the first direction signal and the second direction signal in parallel.

13. The non-transitory computer-readable storage medium of claim 11, wherein the memory cell is a bidirectional resistive memory cell, wherein the first memory array driver is coupled to a first voltage source having a first polarity, and wherein the second memory array driver is coupled to a second voltage source having a second polarity opposite to the first polarity.

* * * * *